(12) United States Patent
Suzuki et al.

(10) Patent No.: US 8,868,073 B2
(45) Date of Patent: Oct. 21, 2014

(54) MOBILE COMMUNICATION METHOD, MOBILE COMMUNICATION SYSTEM, SUBSCRIBER MANAGEMENT SERVER DEVICE, AND MOBILE SWITCHING CENTER

(75) Inventors: Keisuke Suzuki, Yokosuka (JP); Itsuma Tanaka, Yokohama (JP); Masashi Kanauchi, Yokosuka (JP)

(73) Assignee: NTT DoCoMo, Inc., Tokyo (JP)

(*) Notice: Subject to any disclaimer, the term of this patent is extended or adjusted under 35 U.S.C. 154(b) by 0 days.

(21) Appl. No.: 13/381,799

(22) PCT Filed: Jul. 2, 2010

(86) PCT No.: PCT/JP2010/061348
§ 371 (c)(1),
(2), (4) Date: Mar. 9, 2012

(87) PCT Pub. No.: WO2011/002088
PCT Pub. Date: Jan. 6, 2011

(65) Prior Publication Data
US 2012/0157100 A1   Jun. 21, 2012

(30) Foreign Application Priority Data
Jul. 3, 2009   (JP) .................. 2009-159197

(51) Int. Cl.
*H04Q 7/20* (2006.01)
*H04W 48/18* (2009.01)
*H04W 60/00* (2009.01)
*H04W 88/14* (2009.01)
*H04W 8/04* (2009.01)

(52) U.S. Cl.
CPC .............. *H04W 48/18* (2013.01); *H04W 60/00* (2013.01); *H04W 88/14* (2013.01); *H04W 8/04* (2013.01)

USPC ........ 455/435.1; 455/436; 455/418; 455/450; 455/466; 370/352; 370/331; 370/312; 370/355

(58) Field of Classification Search
USPC .................. 455/435.3, 435.2, 435.1
See application file for complete search history.

(56) References Cited

U.S. PATENT DOCUMENTS
2008/0037515 A1* 2/2008 Sander .......................... 370/352

FOREIGN PATENT DOCUMENTS
EP      2071882 A2    6/2009
JP      2009-267709 A  11/2009

OTHER PUBLICATIONS

3GPP TS 23.401 V8.6.0, Jun. 2009, "3rd Generation Partnership Project; Technical Specification Group Services and System Aspects; General Packet Radio Service (GPRS) enhancements for Evolved Universal Terrestrial Radio Access Network (E-UTRAN) access (Release 8)," 227 pages.

(Continued)

*Primary Examiner* — Charles Appiah
*Assistant Examiner* — Randy Peaches
(74) *Attorney, Agent, or Firm* — Osha Liang LLP

(57) ABSTRACT

A mobile communication method according to the present invention comprising the subscriber management server device HSS determines either the radio access network of the WCDMA scheme or the radio access network of the LTE scheme as the standby radio access network of the mobile station UE based on the CSFB capability presence/absence information included in the received "Update GPRS Location/Update Location Request" of received the mobile station UE, and a step in which the mobile station UE performs the standby operation in the standby radio access network of the mobile station UE determined by the subscriber management server device HSS.

2 Claims, 12 Drawing Sheets

(56) References Cited

OTHER PUBLICATIONS

3GPP TS 24.301 V8.2.1, Jun. 2009, "3rd Generation Partnership Project; Technical Specification Group Core Network and Terminals; Non-Access-Stratum (NAS) protocol for Evolved Packet System (EPS); Stage 3 (Release 8)," 252 pages.

3GPP TS 29.272 v8.3.0, Jun. 2009, "3rd Generation Partnership Project; Technical Specification Group Core Network and Terminals; Evolved Packet System (EPS); Mobility Management Entity (MME) and Serving GPRS Support Node (SGSN) related interfaces based on Diameter protocol (Release 8)," 70 pages.

International Search Report issued in PCT/JP2010/061348, with translation, 2 pages.

Office Action for Chinese Patent Application No. 201080029875.4 dated Aug. 27, 2012, with English translation thereof (9 pages).

3GPP TS 23.272, vol. 9.0.0, "3rd Generation Partnership Project; Technical Specification Group Services and System Aspects; Circuit Switched Fallback in Evolved Packet System;" Stage 2 Release 9 (Jun. 2009) (6 pages).

3GPP TS 23.401 vol. 9.1.0, "3rd Generation Partnership Project; Technical Specification Group Services and System Aspects; General Packet Radio Service (GPRS) enhancements for Evolved Universal Terrestrial Radio Access Network (E-TRAN) access," Release 9 (Jun. 2009) (13 pages).

Office Action for Chinese Application No. 201080029875.4 dated Jan. 15, 2013, with English translation thereof (10 pages).

Extended European search report for European Application No. 10794256.7 dated Jan. 30, 2013 (9 pages).

ETSI TS 123 060 V8.5.1; "Digital cellular telecommunications system (Phase 2+); Universal Mobile Telecommunications System (UMTS); General Packet Radio Service (GPRS); Service description; Stage 2"; (3GPP TS 23.060 version 8.5.1 Release 8) Jun. 2009 (4 pages).

3GPP TSG RAN WG3 Meeting #60, R3-081142; "Subscriber Type Transfer over S1 and X2"; Huawie; Kansas City, USA, May 5-9, 2008 (3 pages).

3GPP TSG SA WG2 Meeting #74, TD S2-094578; "Improving user experience with CS fallback"; Telecom Italia; Sophia Antipolis, France, Jul. 6-10, 2009 (2 pages).

3GPP TSG SA WG2 Meeting #63, TD S2-081755; "Iu-CS based CS fallback architecture"; Huawei, China Mobile, China Unicom, CATT; Athens, Greece, Feb. 18-22, 2008 (17 pages).

\* cited by examiner

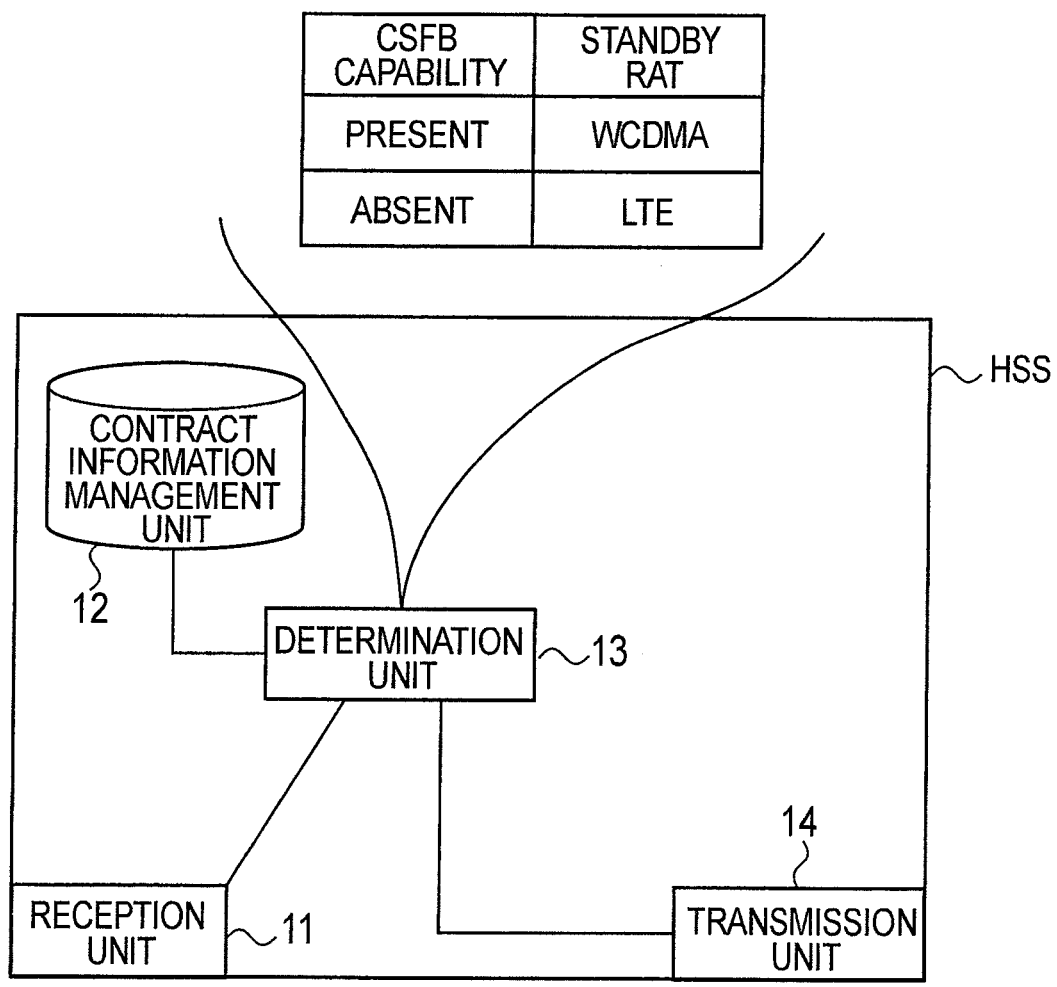

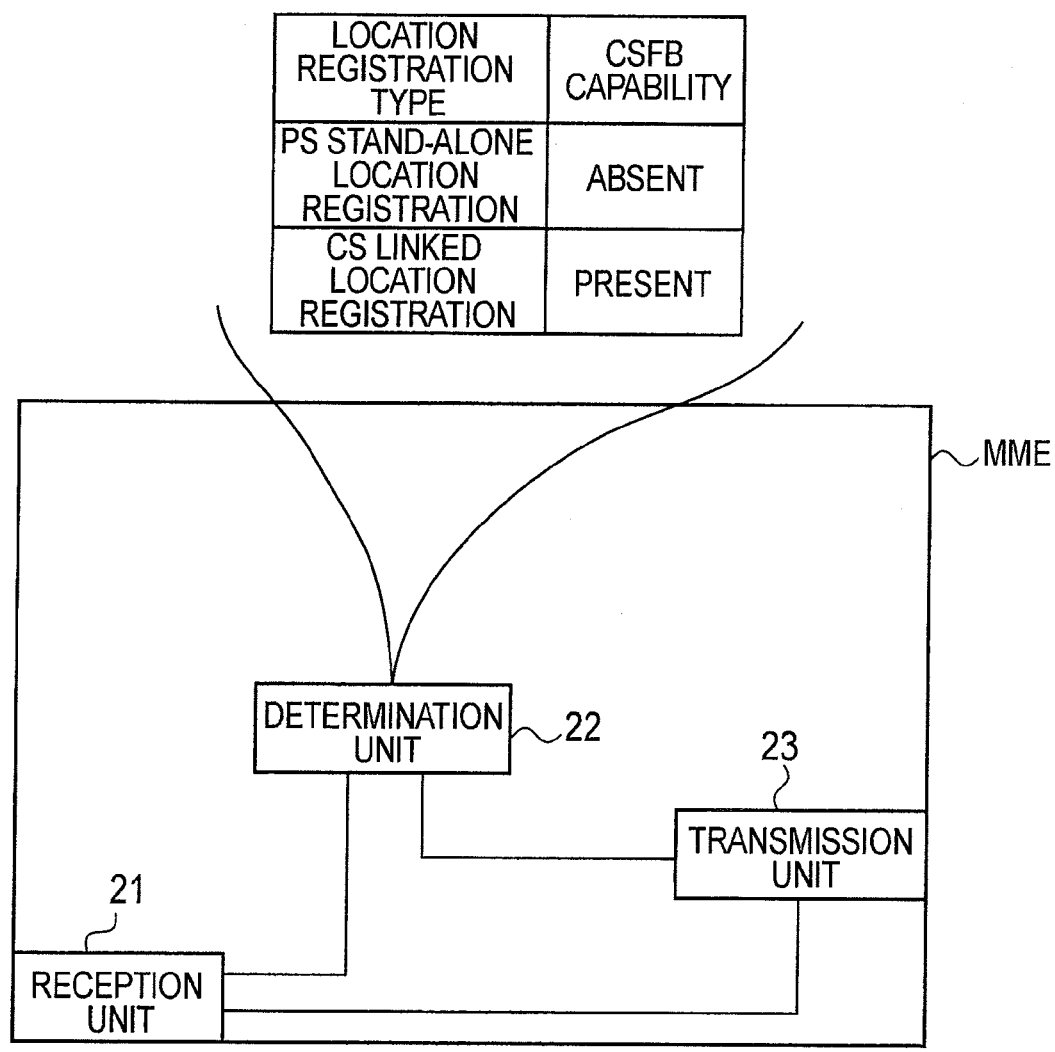

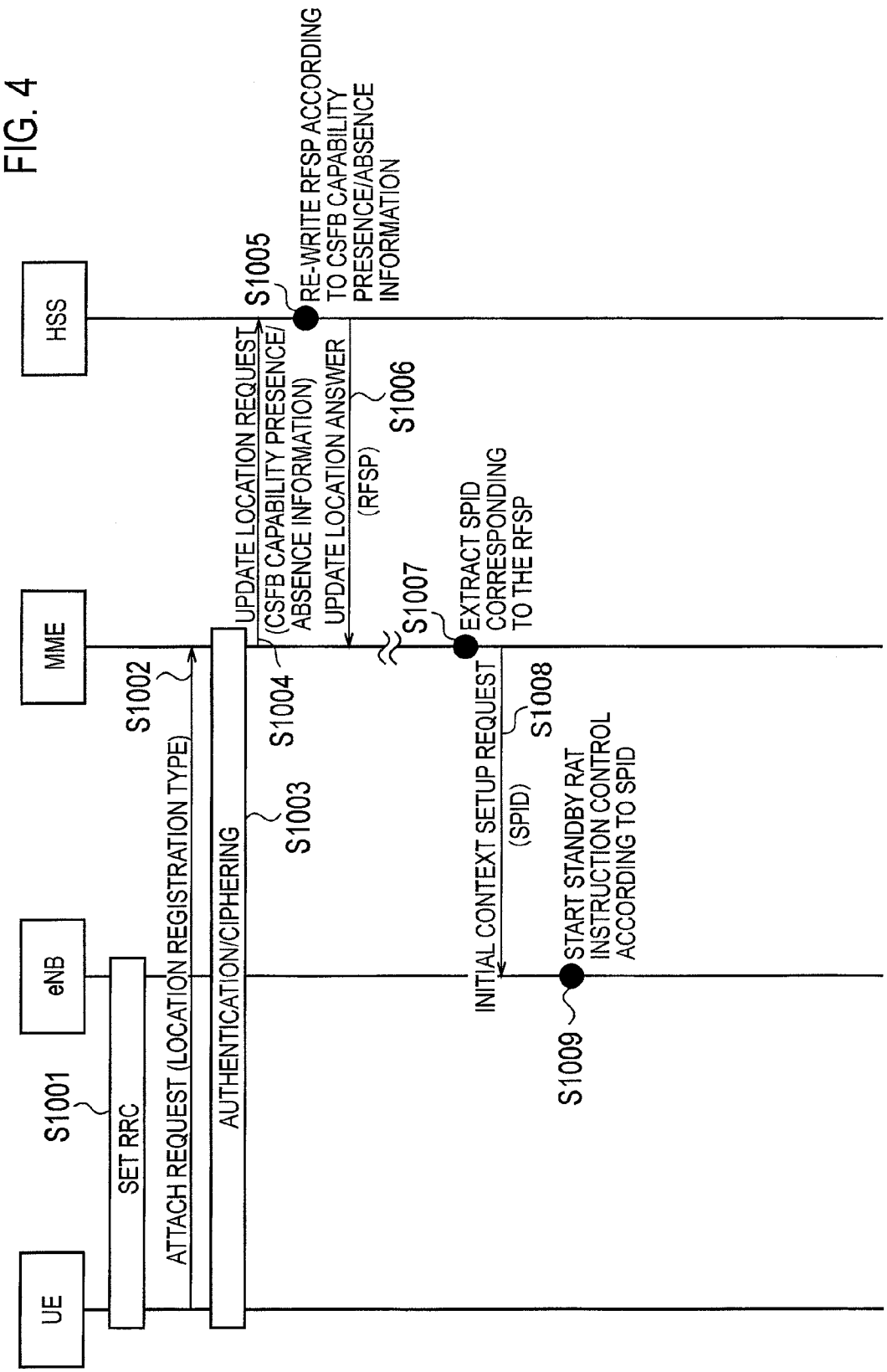

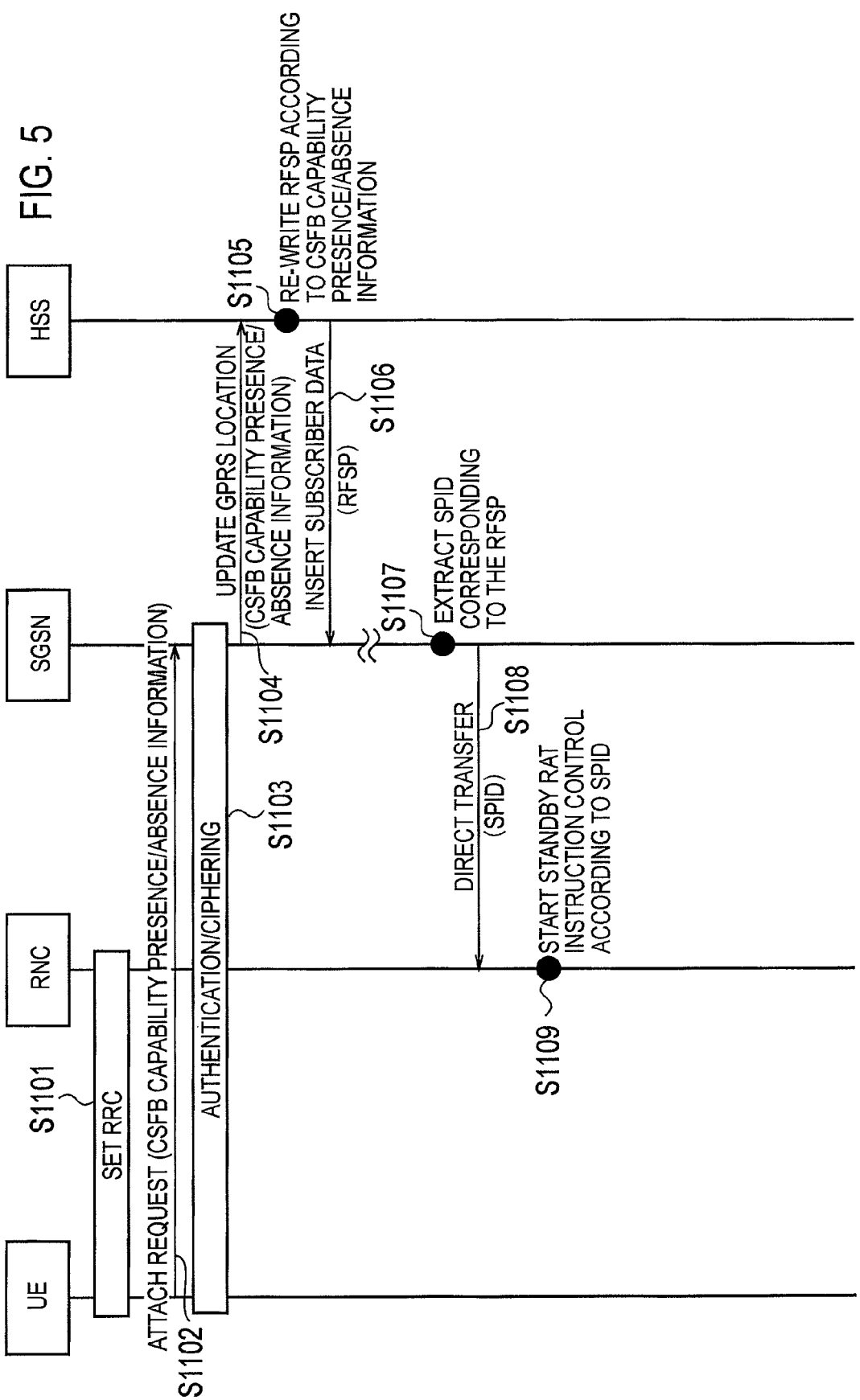

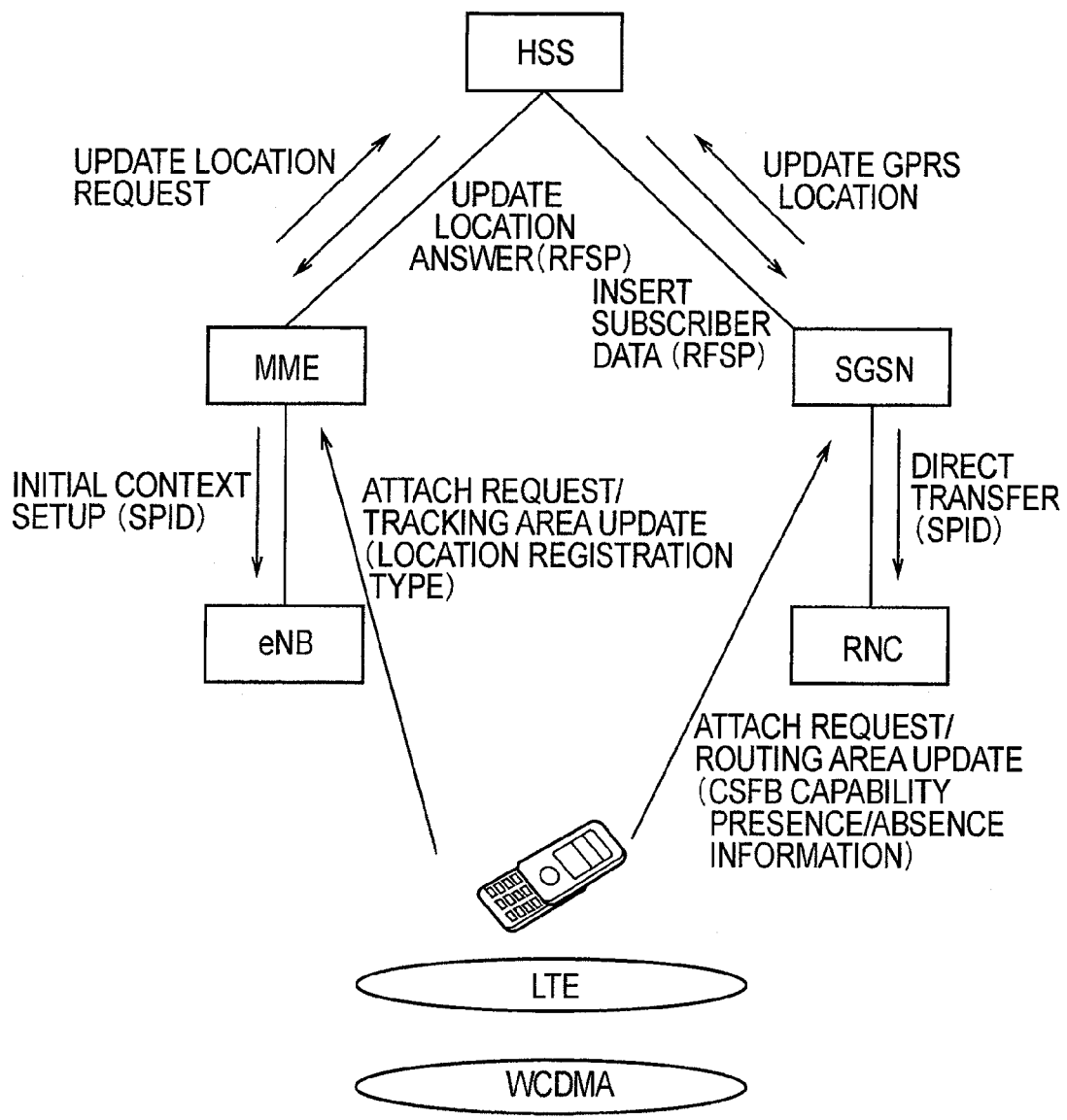

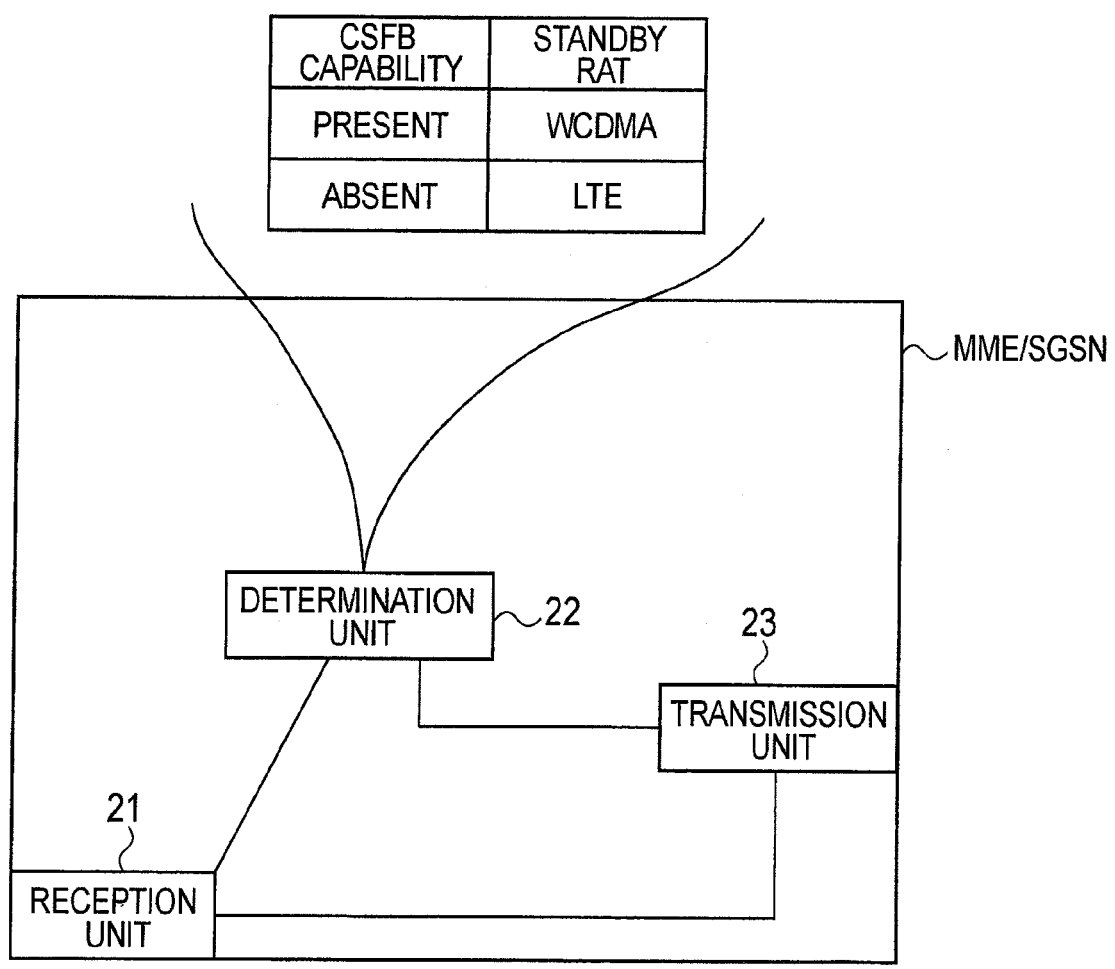

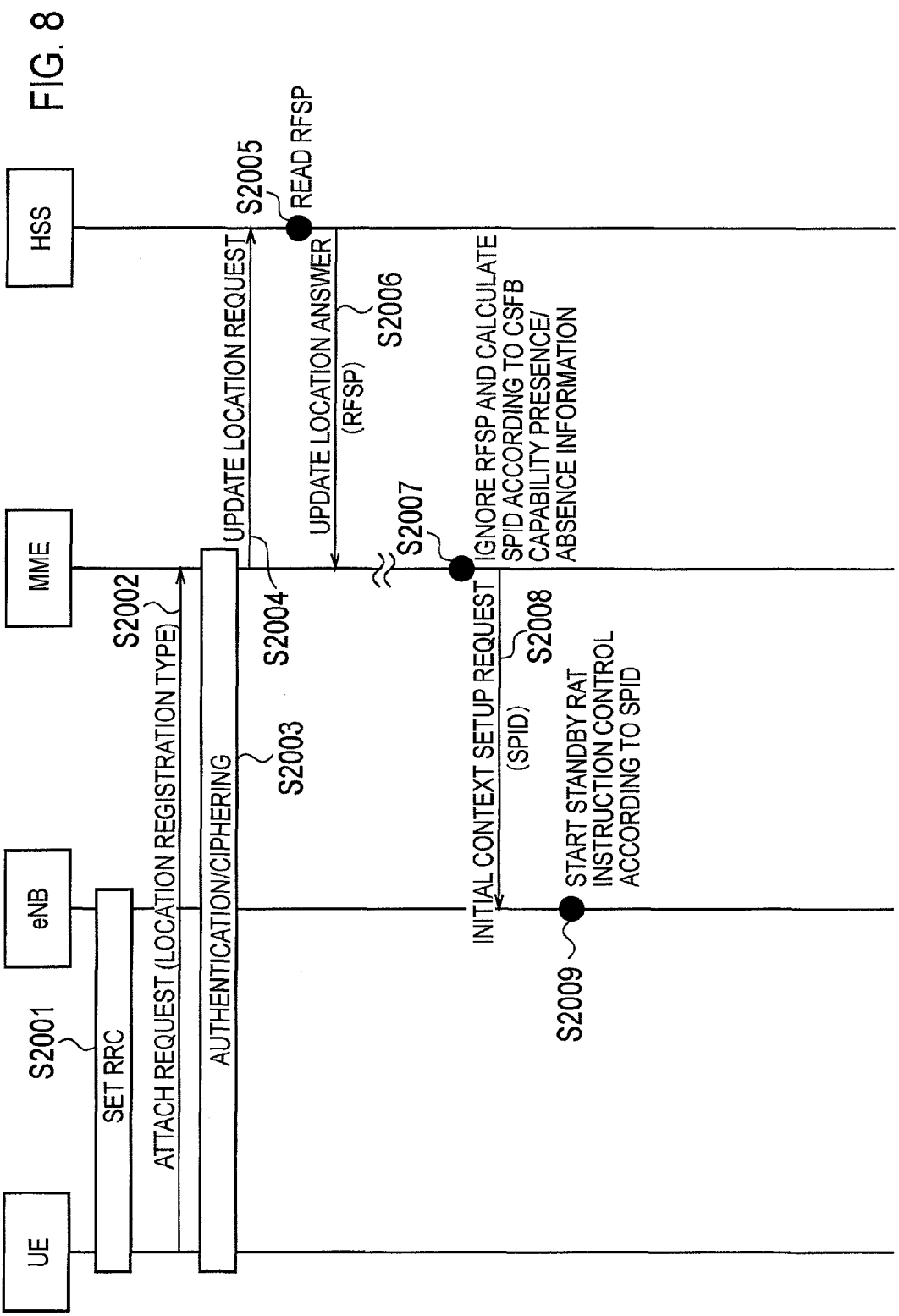

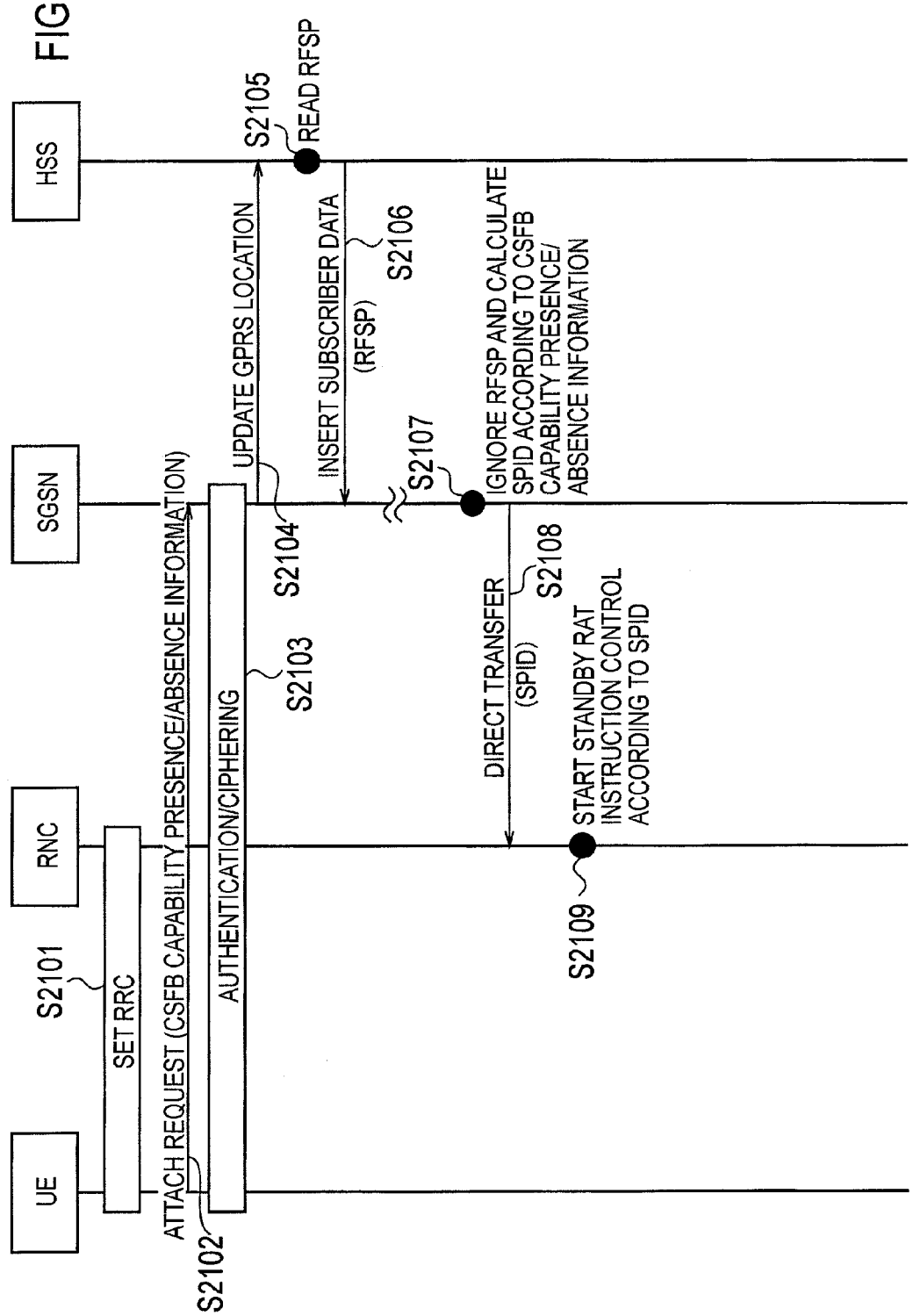

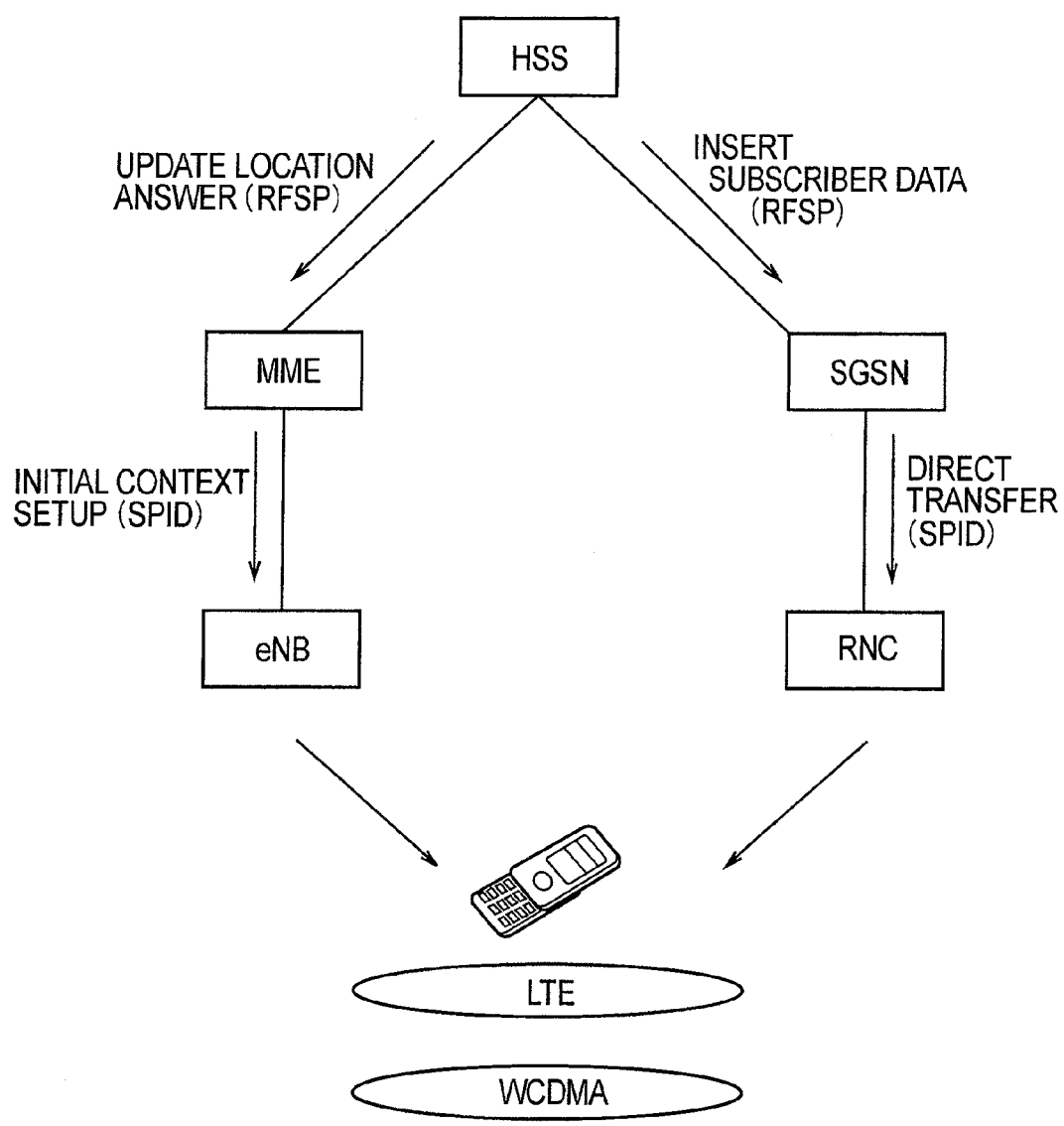

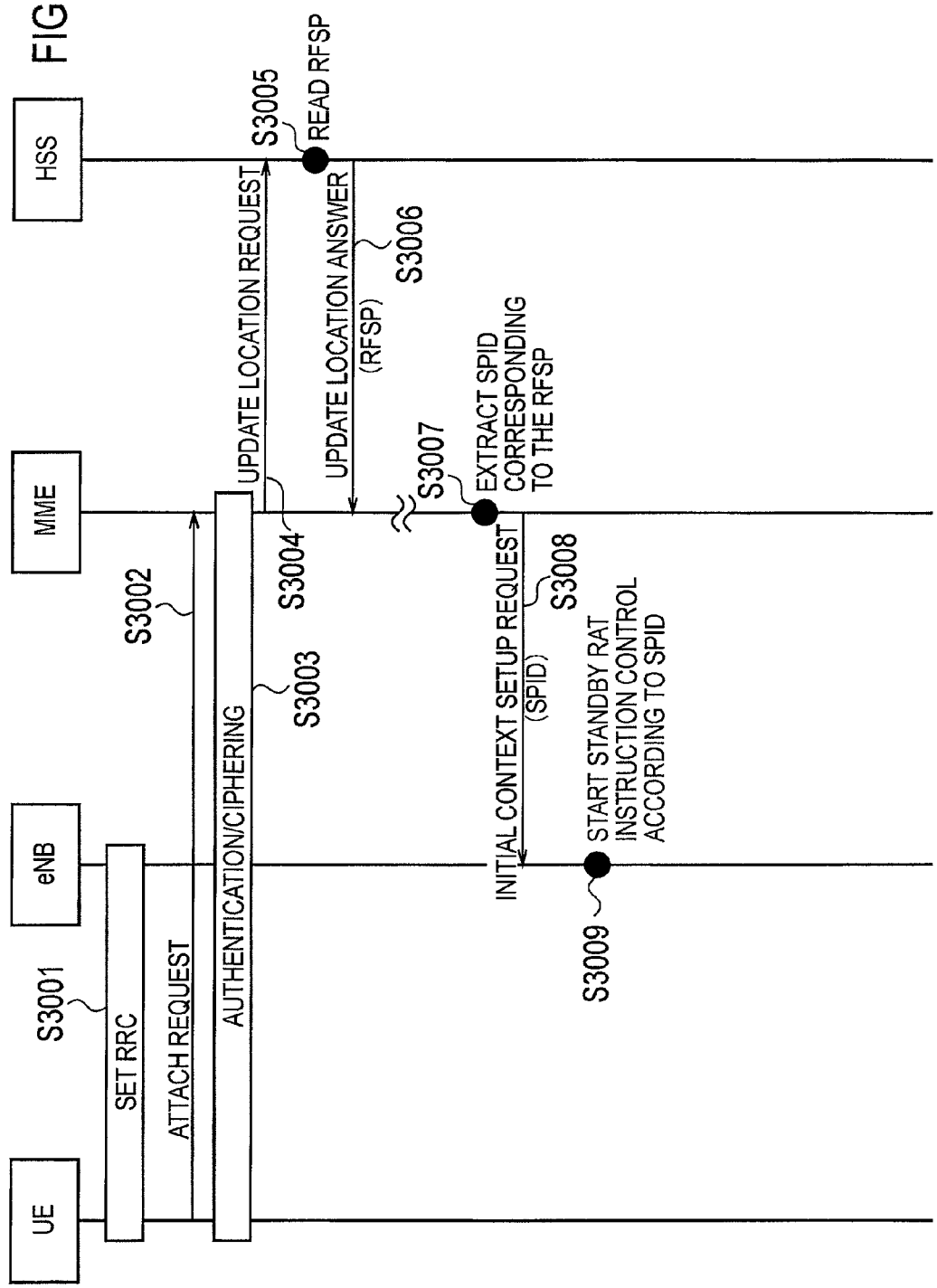

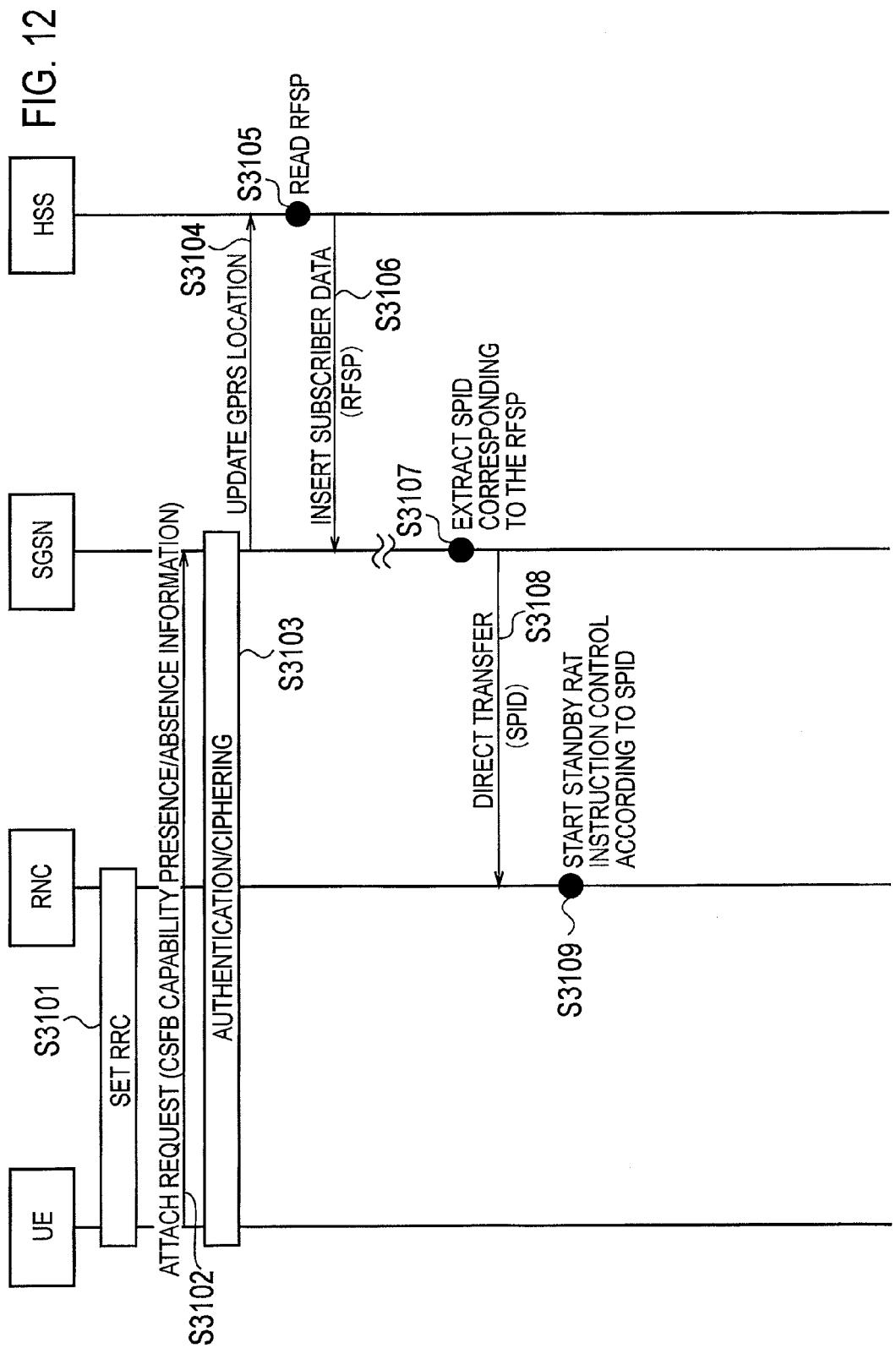

MOBILE COMMUNICATION METHOD, MOBILE COMMUNICATION SYSTEM, SUBSCRIBER MANAGEMENT SERVER DEVICE, AND MOBILE SWITCHING CENTER

TECHNICAL FIELD

The present invention relates to a mobile communication method, a mobile communication system, a subscriber management server device, and a mobile switching center.

BACKGROUND ART

With reference to FIG. 10 through FIG. 12, a standby operation of a mobile station UE in a mobile communication system imparted with an EPC (Evolved packet Core) network incorporating a radio access network of a WCDMA scheme and a radio access network of an LTE (Long Term Evolution) scheme is explained. FIG. 10 shows a configuration and an outline of an operation of the mobile communication system.

Firstly, with reference to FIG. 11, an example of an operation when the mobile station UE attempts to perform a location registration process in the radio access network of the LTE scheme is explained.

As shown in FIG. 11, the mobile station UE establishes an RRC (Radio Resource Control) connection with a radio base station eNB in step S3001, and then in step S3002, it transmits an "Attach Request" to a mobile switching center MME.

After performing a process for authentication and ciphering of the mobile station UE between the mobile station UE and the mobile switching center MME in step S3003, the mobile switching center MME transmits an "Update Location Request" to a subscriber management server device HSS in step S3004.

In step S3005, based on the contract information of the mobile station UE, the subscriber management server device HSS determines "RFSP (RAT Frequency Selection Priority)" showing the "RAT (Radio Access Technology, radio access network)" for which the mobile center UE must preferentially perform the standby operation.

In step S3006, the subscriber management server device HSS transmits an "Update Location Answer" including the RFSP to the mobile switching center MME.

In step S3007, the mobile switching center MME extracts "SPID (Subscriber Profile ID for RAT/Frequency Priority)" corresponding to the RFSP included in the received "Update Location Answer", and then in step S3008, it transmits an "Initial Context Setup Request" including the extracted SPID to the radio base station eNB.

In step S3009, the radio base station eNB performs a standby RAT instruction for the mobile station UE based on the SPID included in the received "Initial Context Setup Request".

Secondly, with reference to FIG. 12, an example of an operation when the mobile station UE attempts to perform a location registration process in the radio access network of the WCDMA scheme is explained.

As shown in FIG. 12, the mobile station UE establishes an RRC connection with a radio network controller RNC in step S3101, and then in step S3102, it transmits an "Attach Request" to a mobile switching center SGSN.

After performing a process for authentication and ciphering of the mobile station UE between the mobile station UE and the mobile switching center SGSN in step S3103, the mobile switching center SGSN transmits an "Update GPRS Location" to the subscriber management server device HSS in step S3104.

In step S3105, based on the contract information of the mobile station UE, the subscriber management server device HSS determines "RFSP" showing the RAT for which the mobile center UE must preferentially perform the standby operation.

In step S3106, the subscriber management server device HSS transmits the "Insert Subscriber Data" including the RFSP to the mobile switching center SGSN, and after receiving its response, it transmits the "Update GPRS Location Ack".

In step S3107, the mobile switching center SGSN extracts the SPID corresponding to the RFSP included in the received "Insert Subscriber Data", and then in step S3108, it transmits a "Direct Transfer" including the extracted SPID to the radio network controller RNC.

In step S3109, the radio network controller RNC performs a standby RAT instruction for the mobile station UE based on the SPID included in the received "Direct Transfer".

However, the aforementioned mobile communication system had a problem in that due to the fact that the standby RAT of each mobile station UE is determined based on the contract information of each mobile station UE, it is not possible to achieve high-speed connection time when the standby RAT of a mobile station UE that does not support CS (Circuit Switch) communication is a radio access network of the LTE scheme, and it is also not possible to reduce the sending and receiving time of CS communication when the standby RAT of a mobile station UE equipped with a CSFB (CS Fallback) function is a radio access network of the WCDMA scheme.

SUMMARY OF THE INVENTION

Thus, the present invention is made in view of the aforementioned problem, and its purpose is to provide a mobile communication method, a mobile communication system, a subscriber management server device, and a mobile switching center that make it possible to determine a standby RAT in accordance with the capabilities of a mobile station UE.

A gist of a first characteristic of the present invention is a mobile communication method with which a mobile station performs a standby operation in a mobile communication system equipped with a first radio access network which can provide circuit switch communication, and a second radio access network which cannot provide the circuit switch communication, but can provide the packet switch communication having a higher speed than the first radio access network, the method comprising a step in which the mobile switching center determines either the first radio access network or the second radio access network as the standby radio access network of the mobile station based on the capability information included in the received location registration request signal, and a step in which the mobile station performs a standby operation in the standby radio access network of the mobile station determined by the mobile switching center.

A gist of a second characteristic of the present invention is a mobile communication method with which a mobile station performs a standby operation in a mobile communication system equipped with a first radio access network which can provide circuit switch communication, and a second radio access network which cannot provide the circuit switch communication, but can provide the packet switch communication having a higher speed than the first radio access network, comprising, a step in which the mobile station transmits a location registration request signal including the capability information of the mobile station to a mobile switching center of the first radio access network, a step in which the mobile switching center of the first radio access network transmits a location information update signal of the mobile station to a subscriber management server device in accordance with the received location registration request signal, a step in which the subscriber management server device transmits a location information update response signal of the mobile station to a the mobile switching center of the first radio access network in accordance with the received location information update signal, a step in which the mobile switching center of the first radio access network determines either the first radio access network or the second radio access network as the standby radio access network of the mobile station based on the capability information of the mobile station included in the received location registration request signal in accordance with the received location information update response signal, and a step in which the mobile station performs a standby operation in the standby radio access network of the mobile station determined by the mobile switching center of the first radio access network.

A gist of a third characteristic of the present invention is a mobile communication method with which a mobile station performs a standby operation in a mobile communication system equipped with a first radio access network which can provide circuit switch communication, and a second radio access network which cannot provide the circuit switch communication, but can provide the packet switch communication having a higher speed than the first radio access network, comprising, a step in which the mobile station transmits a location registration request signal of the mobile station including the location registration type to a mobile switching center of the second radio access network, a step in which the mobile switching center of the second radio access network transmits a location information update signal of the mobile station to a subscriber management server device in accordance with the received location registration request signal, a step in which the subscriber management server device transmits a location information update response signal of the mobile station to a the mobile switching center of the second radio access network in accordance with the received location information update signal, a step in which the mobile switching center of the second radio access network determines either the first radio access network or the second radio access network as the standby radio access network of the mobile station based on the capability information of the mobile station determined based on the location registration type included in the received location registration request signal in accordance with the received location registration response signal, and a step in which the mobile station performs a standby operation in the standby radio access network of the mobile station determined by the mobile switching center of the second radio access network.

A gist of a forth characteristic of the present invention is a mobile switching center provided in a mobile communication system equipped with the first radio access network which can provide circuit switch communication, and a second radio access network which cannot provide the circuit switch communication, but can provide the packet switch communication having a higher speed than the first radio access network, comprising a determination unit configured to determine either the first radio access network or the second radio access network as the standby radio access network of a mobile station based on the capability information of the mobile station included in received the location information update signal of the mobile station and a standby processing unit configured to perform the standby operation in the standby radio access network of the mobile station determined by the subscriber management server device.

A gist of a fifth characteristic of the present invention is a mobile switching center of a first radio access network provided in a mobile communication system equipped with a first radio access network which can provide circuit switch communication, and the second radio access network which cannot provide the circuit switch communication, but can provide the packet switch communication having a higher speed than the first radio access network, comprising, a determination unit configured to determine either the first radio access network or the second radio access network as the standby radio access network of a mobile station based on the capability information of the mobile station included in received the location registration request signal from the mobile station in accordance with a location information update response signal received from a subscriber management server device, and a standby processing unit configured to perform the standby operation in the standby radio access network of the mobile station determined by the mobile switching center of the first radio network.

A gist of a sixth characteristic of the present invention is a mobile switching center of a second radio access network provided in a mobile communication system equipped with a first radio access network which can provide circuit switch communication, and the second radio access network which cannot provide the circuit switch communication, but can provide the packet switch communication having a higher speed than the first radio access network, comprising, a determination unit configured to determine either the first radio access network or the second radio access network as the standby radio access network of a mobile station based on the capability information of the mobile station determined based on the location registration type included in the location registration request signal received from the mobile station in accordance with a location information update response signal received from a subscriber management server device, and a standby processing unit configured to perform the standby operation in the standby radio access network of the mobile station determined by the mobile switching center of the second radio network.

A gist of a seventh characteristic of the present invention is a subscriber management server device provided in a mobile communication system equipped with a first radio access network which can provide circuit switch communication, and the second radio access network which cannot provide the circuit switch communication, but can provide the packet switch communication having a higher speed than the first radio access network, comprising, a determination unit configured to determine either the first radio access network or the second radio access network as the standby radio access network of a mobile station based on the capability information of the mobile station included in received the location information update signal of the mobile station and a transmission unit configured to transmit a location information update response signal including specific information of the determined standby radio access network of the mobile station to the mobile switching center of the second radio access network or the mobile station to the mobile switching center of the first radio access network.

A gist of a eighth characteristic of the present invention is a mobile switching center of the first radio access network provided in a mobile communication system equipped with a first radio access network which can provide circuit switch communication, and the second radio access network which cannot provide the circuit switch communication, but can provide the packet switch communication having a higher speed than the first radio access network, comprising, a determination unit configured to determine either the first radio access network or the second radio access network as the standby radio access network of a mobile station based on the capability information included in the location registration request signal received from the mobile station in accordance with the received location information update response signal from a subscriber management server device, and a transmission unit configured to transmit a signal including specific information of the determined standby radio access network of the mobile station to the radio access network device of the second radio access network or the radio access network device of the first radio access network.

A gist of a ninth characteristic of the present invention is a mobile switching center of the second radio access network provided in a mobile communication system equipped with a first radio access network which can provide circuit switch communication, and the second radio access network which cannot provide the circuit switch communication, but can provide the packet switch communication having a higher speed than the first radio access network, comprising, a determination unit configured to determine either the first radio access network or the second radio access network as the standby radio access network of a mobile station based on the capability information of the mobile station determined based on the location registration type included in the location registration request signal received from the mobile station in accordance with a location information update response signal received from a subscriber management server device, and a transmission unit configured to transmit a signal including specific information of the determined standby radio access network of the mobile station to the radio access network device of the second radio access network or the radio access network device of the first radio access network.

As described above, according to the present invention, it is possible to provide a mobile communication method, a mobile communication system, a subscriber management server device, and a mobile switching center that make it possible to determine a standby RAT in accordance with the capabilities of a mobile station UE.

BRIEF DESCRIPTION OF THE DRAWINGS

FIG. 2 is a functional block diagram of a subscriber management server device according to the first embodiment of the present invention.

FIG. 3 is a functional block diagram of a mobile switching center according to the first embodiment of the present invention.

FIG. 4 is a sequence diagram showing an operation of the mobile communication system according to the first embodiment of the present invention.

FIG. 5 is a sequence diagram showing an operation of the mobile communication system according to the first embodiment of the present invention.

FIG. 6 is a diagram showing an entire configuration of a mobile communication system according to a first modification of the present invention.

FIG. 7 is a functional block diagram of a mobile switching center according to the first modification of the present invention.

FIG. 8 is a sequence diagram showing an operation of the mobile communication system according to the first modification of the present invention.

FIG. 9 is a sequence diagram showing an operation of the mobile communication system according to the first modification of the present invention.

FIG. 10 is a diagram showing an entire configuration of a conventional mobile communication system.

FIG. 11 is a sequence diagram showing an operation of a conventional mobile communication system.

FIG. 12 is a sequence diagram showing an operation of a conventional mobile communication system.

Figure 1:
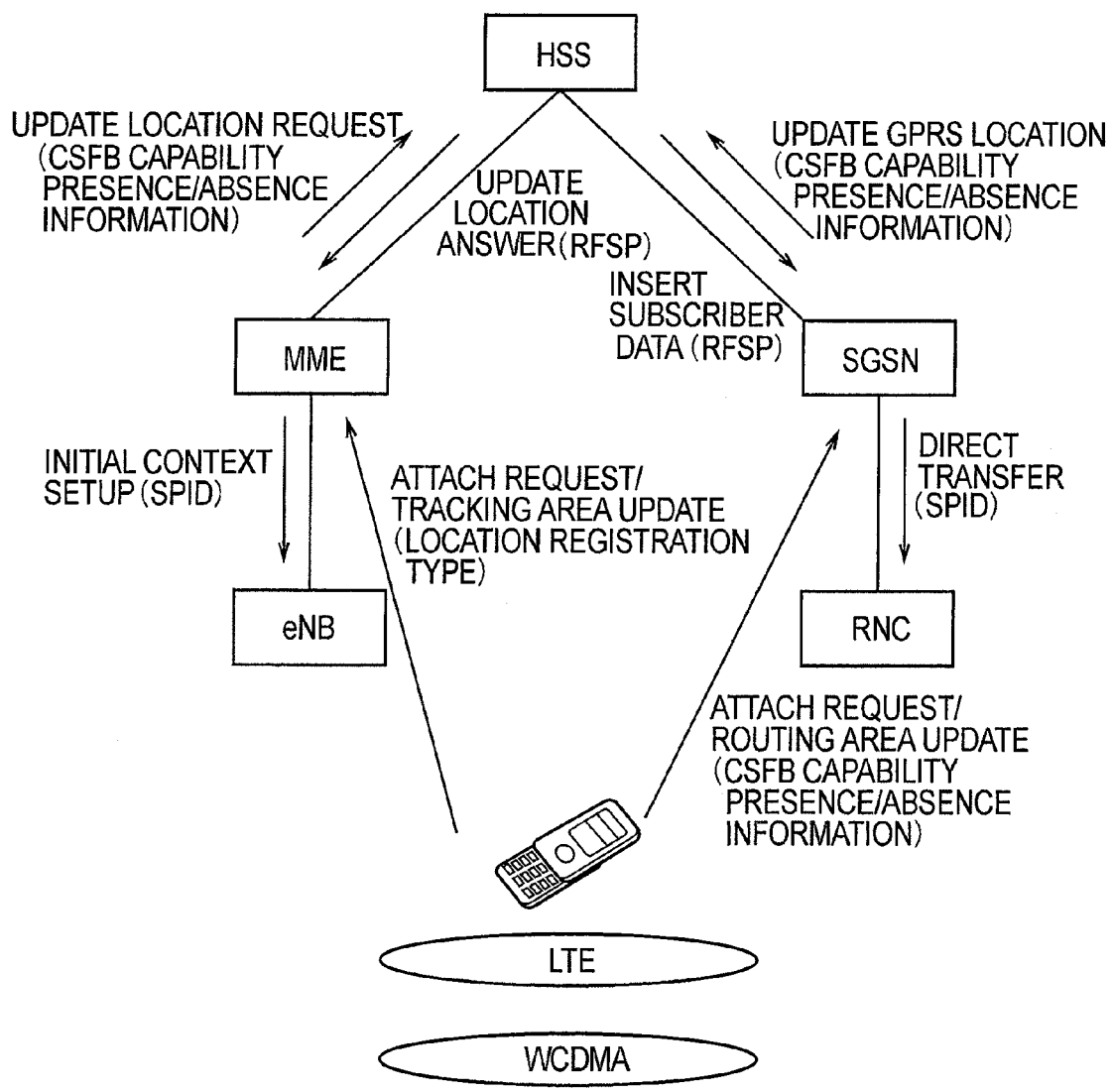
FIG. 1 is a diagram showing an entire configuration of a mobile communication system according to a first embodiment of the present invention.

DETAILED DESCRIPTION (Mobile Communication System According to the First Embodiment of the Present Invention)

The mobile communication system according to the first embodiment of the present invention is described with reference to FIG. 1 through FIG. 5.

As shown in FIG. 1, the mobile communication system according to the present embodiment is imparted with an EPC network incorporating a radio access network of a WCDMA scheme (a first radio access network) and a radio access network of an LTE scheme (a second radio access network).

Here, the radio access network of the WCDMA scheme is configured to provide the CS communication. On the other hand, the radio access network of the LTE scheme does not provide the CS communication, but is configured to provide the PS (Packet Switch) communication having a higher speed than the radio access network of the WCDMA scheme.

As shown in FIG. 2, the subscriber management server device HSS includes a reception unit 11, a contract information management unit 12, a determination unit 13, and a transmission unit 14.

The reception unit 11 is configured to receive the "Update GPRS Location (location information update signal)" transmitted by the mobile switching center SGSN of the radio access network of the WCDMA scheme, and the "Update Location Request (location information update signal)" transmitted by the mobile switching center MME of the radio access network of the LTE scheme.

The contract information management unit 12 is configured to manage the contract information of each mobile station UE. For example, the contract information management unit 12 is configured to manage the RFSP of each mobile station UE as the contract information of each mobile station UE.

The determination unit 13 is configured to determine the RFSP corresponding to the standby RAT of the mobile station UE based on the CSFB capability presence/absence information included in the "Update GPRS Location" or the "Update Location Request" received by the reception unit 11.

Here, the CSFB capability presence/absence information is a type of capability information indicating whether or not the mobile station UE is equipped with the CSFB function.

For example, the determination unit 13 manages a table correlating the "CSFB capability" and the "standby RAT" as shown in FIG. 12, and when the aforementioned CSFB capability presence/absence information indicates that "CSFB capability"="Present", the standby RAT of the mobile station UE may be set as a radio access network of a WCDMA scheme, and when the aforementioned CSFB capability presence/absence information indicates that "CSFB capability"="Absent", the standby RAT of the mobile station UE may be set as a radio access network of an LTE scheme.

Note that the determination unit 13 may also be configured to determine the RFSP corresponding to the standby RAT of the mobile station UE based on the RFSP of the mobile station UE managed by the contract information management unit 12 rather than the CSFB capability presence/absence information, when a predetermined condition is satisfied such as when the "Update GPRS Location" or the "Update Location Request" received by the reception unit 11 does not include the CSFB capability presence/absence information.

The transmission unit 14 is configured to transmit the "Update Location Answer (location information update response signal)" including the RFSP determined by the determination unit 14 to the mobile switching center MME, and to transmit the "Insert Subscriber Data (subscriber information transmission signal)" including the RFSP determined by the determination unit 13, and is also configured to transmit the "Update GPRS Location Ack (location information update response signal)" to the mobile switching center SGSN after receiving a response thereof.

As shown in FIG. 3, the mobile switching center MME includes a reception unit 21, a determination unit 22, and a transmission unit 23.

The reception unit 21 is configured to receive the "Attach Request/Tracking Area Update (location registration request signal)" transmitted by the mobile station UE, and the "Update Location Answer" transmitted by the subscriber management server device HSS.

The determination unit 22 is configured to determine the CSFB capability presence/absence information of the mobile station UE based on the location registration type included in the "Attach Request/Tracking Area Update (location registration request signal)" of the mobile station UE that is received by the reception unit 21.

For example, the determination unit 22 manages a table correlating the "location registration type" and the "CSFB capability" as shown in FIG. 3, and when the location registration type included in the "Attach Request/Tracking Area Update (location registration request signal)" of the mobile station UE that is received by the reception unit 21 is "PS stand-alone location registration", the CSFB capability presence/absence information of the mobile station UE may be determined as CSFB capability presence/absence information indicating that "CSFB capability"="Absent", and when the location registration type included in the "Attach Request/Tracking Area Update" of the mobile station UE that is received by the reception unit is "CS linked location registration", the CSFB capability presence/absence information of the mobile station UE may be determined as CSFB capability presence/absence information indicating that "CSFB capability"="Present".

The transmission unit 23 is configured to transmit the "Update Location Request" including the CSFB capability presence/absence information of the mobile station UE determined by the determination unit 22 to the subscriber management server device HSS.

Furthermore, the transmission unit 23 is configured to transmit the "Initial Context Setup" including the SPID corresponding to the RFSP included in the "Update Location Answer" received by the reception unit 21 to the radio base station eNB.

Hereinafter, an operation of the mobile communication system according to the present embodiment is explained with reference to FIG. 4 and FIG. 5.

Firstly, with reference to FIG. 4, an example of an operation when the mobile station UE attempts to perform a location registration process in the radio access network of the LTE scheme is explained.

As shown in FIG. 4, the mobile station UE establishes an RRC connection with a radio base station eNB in step S1001, and then in step S1002, it transmits an "Attach Request" including the location registration type to a mobile switching center MME.

After performing a process for authentication and ciphering of the mobile station UE between the mobile station UE and the mobile switching center MME in step S1003, the mobile switching center MME determines the CSFB capability presence/absence information corresponding to the location registration type included in the "Attach Request", and transmits an "Update Location Request" including the determined CSFB capability presence/absence information to a subscriber management server device HSS in step S1004.

In step S1005, the subscriber management server device HSS rewrites the RFSP managed as the contract information of the mobile station UE, with the RFSP corresponding to the CSFB capability presence/absence information of the mobile station UE included in the "Update Location Request".

In step S1006, the subscriber management server device HSS transmits an "Update Location Answer" including the re-written RFSP to the mobile switching center MME.

In step S1007, the mobile switching center MME extracts the SPID corresponding to the RFSP included in the received "Update Location Answer", and then in step S1008, it transmits an "Initial Context Setup Request" including the extracted SPID to the radio base station eNB.

In step S1009, the radio base station eNB performs a standby RAT instruction for the mobile station UE based on the SPID included in the received "Initial Context Setup Request".

Secondly, with reference to FIG. 5, an example of an operation when the mobile station UE attempts to perform a location registration process in the radio access network of the WCDMA scheme is explained.

As shown in FIG. 5, the mobile station UE establishes an RRC connection with a radio network controller RNC in step S1101, and then in step S1102, it transmits an "Attach Request" including the CSFB capability presence/absence information of the mobile station UE to a mobile switching center SGSN.

After performing a process for authentication and ciphering of the mobile station UE between the mobile station UE and the mobile switching center SGSN in step S1103, the mobile switching center SGSN transmits an "Update GPRS Location" including the CSFB capability presence/absence information of the mobile station UE included in the "Attach Request" to the subscriber management server device HSS in step S1104.

In step S1105, the subscriber management server device HSS rewrites the RFSP managed as the contract information of the mobile station UE, with the RFSP corresponding to the CSFB capability presence/absence information of the mobile station UE included in the "Update GPRS Location".

In step S1106, the subscriber management server device HSS transmits the "Insert Subscriber Data" including the re-written RFSP to the mobile switching center SGSN, and after receiving its response, it transmits the "Update GPRS Location Ack".

In step S1107, the mobile switching center SGSN extracts the SPID corresponding to the RFSP included in the received "Insert Subscriber Data", and then in step S1108, it transmits a "Direct Transfer" including the extracted SPID to the radio network controller RNC.

In step S1109, the radio network controller RNC performs a standby RAT instruction for the mobile station UE based on the SPID included in the received "Direct Transfer".

According to the mobile communication system of the first embodiment of the present invention, because the subscriber management server device HSS can determine the standby RAT of the mobile station UE based on the CSFB capability presence/absence information indicating whether or not the mobile station UE is equipped with the CSFB function, it is possible to achieve high-speed connection time when the standby RAT of the mobile station UE that does not support CS communication is a radio access network of the LTE scheme, and it is also possible to reduce the sending and receiving time of CS communication when the standby RAT of the mobile station UE equipped with the CSFB function is a radio access network of the WCDMA scheme.

Furthermore, according to the mobile communication system of the first embodiment of the present invention, because the mobile switching station MME can convert the location registration type included in the "Attach Request/Tracking Area Update" transmitted by the mobile station UE to the CSFB capability presence/absence information, the standby RAT of the mobile station UE can be determined in accordance with the capabilities of the mobile station UE (availability status of the CSFB function) even in a radio access network of an LTE scheme which cannot transmit the CSFB capability presence/absence information.

(First Modification)

A mobile communication system according to a first modification of the present invention is described with reference to FIG. 6 through FIG. 9. Hereinafter, the explanation of the mobile communication system according to the first modification of the present invention is focused on the differences from the mobile communication system according to the aforementioned first embodiment.

As shown in FIG. 7, the mobile switching center MME and the mobile switching center SGSN include a reception unit 21, a determination unit 22, and a transmission unit 23.

The reception unit 21 of the mobile switching center SGSN is configured to receive the "Attach Request/Routing Area Update (location registration request signal)" transmitted by the mobile station UE, and the "Insert Subscriber Data (subscriber information transmission signal" and "Update GPRS Location Ack (location information update response signal)" transmitted by the subscriber management server device HSS.

The determination unit 22 of the mobile switching center SGSN is configured to determine either a radio access network of a WCDMA scheme or a radio access network of an LTE scheme as the standby radio access network of the mobile station UE based on the CSFB capability presence/absence information of the mobile station UE included in the "Attach Request/Routing Area Update" received from the mobile station UE in accordance with the "Insert Subscriber Data" received from the subscriber management server device HSS.

On the other hand, the determination unit 22 of the mobile switching center MME is configured to determine either a radio access network of a WCDMA scheme or a radio access network of an LTE scheme as the standby radio access network of the mobile station UE based on the CSFB capability presence/absence information of the mobile station UE determined based on the position registration type included in the "Attach Request/Tracking Area Update" received from the mobile station UE in accordance with the "Update Location Answer" received from the subscriber management server device HSS.

For example, the determination unit 22 manages a table correlating the "CSFB capability" and the "standby RAT" as shown in FIG. 7, and when the aforementioned CSFB capability presence/absence information indicates that "CSFB capability"="Present", the standby RAT of the mobile station UE may be set as a radio access network of a WCDMA scheme, and when the aforementioned CSFB capability presence/absence information indicates that "CSFB capability"="Absent", the standby RAT of the mobile station UE may be set as a radio access network of an LTE scheme.

The transmission unit 23 of the mobile switching center SGSN is configured to transmit the "Direct Transfer (signal)" including specific information (SPID) of the determined standby radio access network of the mobile station UE to the radio network controller RNC (radio access network device) of the radio access network of the WCDMA scheme.

Hereinafter, an operation of the mobile communication system according to the first modification is explained with reference to FIG. 8 and FIG. 9.

Firstly, with reference to FIG. 8, an example of an operation when the mobile station UE attempts to perform a location registration process in the radio access network of the LTE scheme is explained.

As shown in FIG. 8, the mobile station UE establishes an RRC connection with a radio base station eNB in step S2001, and then in step S2002, it transmits an "Attach Request" including the location registration type to a mobile switching center MME.

After performing a process for authentication and ciphering of the mobile station UE between the mobile station UE and the mobile switching center MME in step S2003, the mobile switching center MME transmits an "Update Location Request" to a subscriber management server device HSS in step S2004.

In step S2005, the subscriber management server device HSS reads the RFSP that is managed as the contract information of the mobile station UE, and then in step S2006, it transmits an "Update Location Answer" including the read RFSP to the mobile switching center MME.

In step S2007, the mobile switching center MME ignores the RFSP included in the received "Update Location Answer", determines the RFSP of the mobile station UE based on the CSFB capability presence/absence information corresponding to the location registration type included in the "Attach Request", and extracts the SPID corresponding to the RFSP. In step S2008, the mobile switching center MME transmits the "Initial Context Setup Request" including the extracted SPID to the radio base station eNB.

In step S2009, the radio base station eNB performs a standby RAT instruction for the mobile station UE based on the SPID included in the received "Initial Context Setup Request".

Secondly, with reference to FIG. 9, an example of an operation when the mobile station UE attempts to perform a location registration process in the radio access network of the WCDMA scheme is explained.

As shown in FIG. 9, the mobile station UE establishes an RRC connection with a radio network controller RNC in step S2101, and then in step S2102, the mobile station UE transmits an "Attach Request" including the CSFB capability presence/absence information of the mobile station UE to a mobile switching center SGSN.

After performing a process for authentication and ciphering of the mobile station UE between the mobile station UE and the mobile switching center SGSN in step S2103, the mobile switching center SGSN transmits an "Update GPRS Location" to the subscriber management server device HSS in step S2104.

In step S2105, the subscriber management server device HSS reads the RFSP that is managed as the contract information of the mobile station UE, and then in step S2106, the subscriber management server device HSS transmits the "Insert Subscriber Data" including the read RFSP to the mobile switching center SGSN, and after receiving a response thereof, it transmits the "Update GPRS Location Ack".

In step S2107, the mobile switching center SGSN ignores the RFSP included in the received "Insert Subscriber Data", determines the RFSP of the mobile station UE based on the CSFB capability presence/absence information included in the "Attach Request", and extracts the SPID corresponding to the RFSP. In step S2108, the mobile switching center SGSN transmits "Direct Transfer" including the extracted SPID to the radio base station eNB.

In step S2109, the radio network controller RNC performs a standby RAT instruction for the mobile station UE based on the SPID included in the received "Direct Transfer".

According to the mobile communication system of the present first modification, because the mobile switching center SGSN or the mobile switching center MME can determine the standby RAT of the mobile station UE based on the CSFB capability presence/absence information indicating whether or not the mobile station UE is equipped with the CSFB function, it is possible to achieve high-speed connection time when the standby RAT of the mobile station UE that does not support CS communication is a radio access network of the LTE scheme, and it is also possible to reduce the sending and receiving time of CS communication when the standby RAT of the mobile station UE equipped with the CSFB function is a radio access network of the WCDMA scheme.

The characteristics of the aforementioned present embodiment can be expressed as follows.

A first characteristic of the present embodiment is summarized as, in a mobile communication system equipped with a radio access network of a WCDMA scheme (first radio access network) which can provide CS (Circuit Switch) communication, and a radio access network of an LTE scheme (second radio access network) which cannot provide the CS communication, but can provide the PS (Packet Switch) communication having a higher speed than the radio access network of the WCDMA scheme, a mobile communication method in which the mobile station UE performs the standby operation, the method comprising: a step in which the subscriber management server device HSS determines either the radio access network of the WCDMA scheme or the radio access network of the LTE scheme as the standby radio access network of the mobile station UE based on the CSFB capability presence/absence information (capability information) included in the received "Update GPRS Location/Update Location Request (location information update signal)" of the mobile station UE; and a step in which the mobile station UE performs the standby operation in the standby radio access network of the mobile station UE determined by the subscriber management server device HSS.

The first characteristic of the present embodiment may further comprise: a step in which the mobile switching center MME of the radio access network of the LTE scheme determines the CSFB capability presence/absence information of the mobile station UE based on the location registration type included in the received "Attach Request/Tracking Area Update (location registration request signal)" of the mobile station UE; and a step in which the mobile switching center MME transmits the "Update Location Request" including the determined CSFB capability presence/absence information of the mobile station UE to the subscriber management server device HSS.

A second characteristic of the present embodiment is summarized as, in a mobile communication system equipped with a radio access network of a WCDMA scheme and a radio access network of an LTE scheme, a mobile communication method in which the mobile station UE performs the standby operation, the method comprising: a step in which the mobile station UE transmits an "Attach Request/Routing Area Update" including the CSFB capability presence/absence information of the mobile station UE to the mobile switching center SGSN of the radio access network of the WCDMA scheme; a step in which the mobile switching center SGSN transmits the "Update GPRS Location" of the mobile station UE to the subscriber management server device HSS in accordance with the received "Attach Request/Routing Area Update"; and a step in which the subscriber management server device HSS transmits the "Insert Subscriber Data (subscriber information transmission signal" and "Update GPRS Location Ack (location information update response signal)" of the mobile station UE to the mobile switching center SGSN in accordance with the received "Update GPRS Location"; a step in which the mobile switching center SGSN determines either the radio access network of the WCDMA scheme or the radio access network of the LTE scheme as the standby radio access network of the mobile station UE based on the CSFB capability presence/absence information of the mobile station UE included in the received "Attach Request/Routing Area Update" in accordance with the received "Insert Subscriber Data"; and a step in which the mobile station UE performs the standby operation in the standby radio access network of the mobile station UE determined by the mobile switching center SGSN.

A third characteristic of the present embodiment is summarized as, in a mobile communication system equipped with a radio access network of a WCDMA scheme and a radio access network of an LTE scheme, a mobile communication method in which the mobile station UE performs the standby operation, the method comprising: a step in which the mobile station UE transmits an "Attach Request/Tracking Area Update" of the mobile station UE including the location registration type to the mobile switching center MME; a step in which the mobile switching center MME transmits the "Update Location Request" of the mobile station UE to the subscriber management server device HSS in accordance with the received "Attach Request/Tracking Area Update"; a step in which the subscriber management server device HSS transmits the "Update Location Answer" of the mobile station UE to the mobile switching center MME in accordance with the received "Update Location Request"; a step in which the mobile switching center MME determines either the radio access network of the WCDMA scheme or the radio access network of the LTE scheme as the standby radio access network of the mobile station UE based on the CSFB capability presence/absence information of the mobile station UE determined based on the location registration type included in the received "Attach Request/Tracking Area Update" in accordance with the received "Update Location Answer"; and a step in which the mobile station UE performs the standby operation in the standby radio access network of the mobile station UE determined by the mobile switching center MME.

A fourth characteristic of the present embodiment is summarized as a mobile communication system equipped with a radio access network of a WCDMA scheme and a radio access network of an LTE scheme, wherein the subscriber management server device HSS is equipped with a determination unit 13 configured to determine either the radio access network of the WCDMA scheme or the radio access network of the LTE scheme as the standby radio access network of the mobile station UE based on the CSFB capability presence/absence information of the mobile station UE included in the received "Update GPRS Location/Update Location Request"

of the mobile station UE, and the mobile station UE is equipped with a standby processing unit configured to perform the standby operation in the standby radio access network of the mobile station UE determined by the subscriber management server device HSS.

In the fourth characteristic of the present embodiment, the mobile switching center MME may further comprise: a determination unit 22 configured to determine the CSFB capability presence/absence information of the mobile station UE based on the location registration type included in the received "Attach Request/Tracking Area Update" of the mobile station UE, and a transmission unit 23 configured to transmit the "Update Location Request" including the determined CSFB capability presence/absence information of the mobile station UE to the subscriber management server device HSS.

A fifth characteristic of the present embodiment is a mobile communication system equipped with a radio access network of a WCDMA scheme and a radio access network of an LTE scheme, wherein the mobile switching center SGSN comprises a determination unit 22 configured to determine either the radio access network of the WCDMA scheme or the radio access network of the LTE scheme as the standby radio access network of the mobile station UE based on the CSFB capability presence/absence information of the mobile station UE included in the "Attach Request/Routing Area Update" received from the mobile station UE in accordance with the "Update GPRS Location Ack" received from the subscriber management server device HSS, and the mobile station UE comprises a standby processing unit configured to perform the standby operation in the standby radio access network of the mobile station UE determined by the mobile switching center SGSN.

A fifth characteristic of the present embodiment is summarized as a mobile communication system equipped with a radio access network of a WCDMA scheme and a radio access network of an LTE scheme, wherein the mobile switching center MME comprises a determination unit 22 configured to determine either the radio access network of the WCDMA scheme or the radio access network of the LTE scheme as the standby radio access network of the mobile station UE based on the CSFB capability presence/absence information of the mobile station UE determined based on the location registration type included in the "Attach Request/Tracking Area Update" received from the mobile station UE in accordance with the "Update Location Answer" received from the subscriber management server device HSS, and the mobile station UE is equipped with a standby processing unit configured to perform the standby operation in the standby radio access network of the mobile station UE determined by the mobile switching center MME.

A sixth characteristic of the present embodiment is a subscriber management server device HSS provided in a mobile communication system equipped with a radio access network of a WCDMA scheme and a radio access network of an LTE scheme, the subscriber management server device HSS comprising: a determination unit 13 configured to determine either the radio access network of the WCDMA scheme or the radio access network of the LTE scheme as the standby radio access network of the mobile station UE based on the CSFB capability presence/absence information of the mobile station UE included in the received "Update GPRS Location/Update Location Request" of the mobile station UE; and a transmission unit 14 configured to transmit the "Insert Subscriber Data/Update Location Answer" including the specific information (RFSP) of the determined standby radio access network of the mobile station UE to the mobile switching center SGSN or the mobile switching center MME.

A seventh characteristic of the present embodiment is summarized as a mobile switching center SGSN provided in a mobile communication system equipped with a radio access network of a WCDMA scheme and a radio access network of an LTE scheme, the mobile switching center SGSN comprising: a determination unit 22 configured to determine either a radio access network of a WCDMA scheme or a radio access network of an LTE scheme as the standby radio access network of the mobile station UE based on the CSFB capability presence/absence information of the mobile station UE included in the "Attach Request/Routing Area Update" received from the mobile station UE in accordance with the "Insert Subscriber Data" received from the subscriber management server device HSS; and a transmission unit 23 configured to transmit the "Direct Transfer (signal)" including specific information (SPID) of the determined standby radio access network of the mobile station UE to the radio network controller RNC (radio access network device) of the radio access network of the WCDMA scheme or the radio base station eNB (radio access network device) of the radio access network of the LTE scheme.

An eighth characteristic of the present embodiment is summarized as a mobile switching center MME provided in a mobile communication system equipped with a radio access network of a WCDMA scheme and a radio access network of an LTE scheme, the mobile switching center MME comprising: a determination unit 22 configured to determine either the radio access network of the WCDMA scheme or the radio access network of the LTE scheme as the standby radio access network of the mobile station UE based on the CSFB capability presence/absence information of the mobile station UE determined based on the location registration type included in the "Attach Request/Tracking Area Update" received from the mobile station UE in accordance with the "Update Location Answer" received from the subscriber management server device HSS; and a transmission unit 23 configured to transmit the "Initial Context Setup (signal)" including specific information (SPID) of the determined standby radio access network of the mobile station UE to the radio network controller RNC or the radio base station eNB.

It is noted that the operation of the above-described the subscriber management server device HSS, the mobile switching center MME/SGSN, the radio base station eNB, the radio network controller RNC or the mobile station UE may be implemented by a hardware, may also be implemented by a software module executed by a processor, and may further be implemented by the combination of the both.

The software module may be arranged in a storage medium of an arbitrary format such as RAM(Random Access Memory), a flash memory, ROM (Read Only Memory), EPROM (Erasable Programmable ROM), EEPROM (Electronically Erasable and Programmable ROM), a register, a hard disk, a removable disk, and CD-ROM.

The storage medium is connected to the processor so that the processor can write and read information into and from the storage medium. Such a storage medium may also be accumulated in the processor. The storage medium and processor may be arranged in ASIC. Such the ASIC may be arranged in the subscriber management server device HSS, the mobile switching center MME/SGSN, the radio base station eNB, the radio network controller RNC or the mobile station UE. Further, such a storage medium or a processor may be arranged, as a discrete component, in the subscriber management server device HSS, the mobile switching center MME/SGSN, the radio base station eNB, the radio network controller RNC or the mobile station UE.

Thus, the present invention has been explained in detail by using the above-described embodiments; however, it is obvious that for persons skilled in the art, the present invention is not limited to the embodiments explained herein. The present invention can be implemented as a corrected and modified mode without departing from the gist and the scope of the present invention defined by the claims. Therefore, the description of the specification is intended for explaining the example only and does not impose any limited meaning to the present invention.

The invention claimed is:

1. A mobile communication method with which a mobile station performs a standby operation in a mobile communication system equipped with a first radio access network which can provide circuit switch communication, and a second radio access network which cannot provide the circuit switch communication, but can provide the packet switch communication having a higher speed than the first radio access network, the method comprising:
    a step in which the mobile station transmits a location registration request signal including the capability information of the mobile station to a mobile switching center of the first radio access network;
    a step in which the mobile switching center of the first radio access network acquires a subscriber information transmission signal of the mobile station from a subscriber management server device in response to the received location registration request signal;
    a step in which the mobile switching center of the first radio access network determines either the first radio access network or the second radio access network as a standby radio access network of the mobile station based on the capability information of the mobile station included in the received location registration request signal from the mobile station and the information contained in the received subscriber information transmission signal from the subscriber management server device;
    a step in which the mobile switching center of the first radio access network transmits a signal including specific information of the determined standby radio access network of the mobile station to a radio access network device of the first radio access network; and
    a step in which the mobile station performs a standby operation in the standby radio access network of the mobile station determined by the mobile switching center of the first radio access network.

2. A mobile switching center of a first radio access network provided in a mobile communication system equipped with the first radio access network which can provide circuit switch communication, and a second radio access network which cannot provide the circuit switch communication, but can provide the packet switch communication having a higher speed than the first radio access network, comprising:
    a determination unit configured to determine either the first radio access network or the second radio access network as a standby radio access network of a mobile station based on the capability information of the mobile station included in the location registration request signal received from the mobile station and the information contained in a subscriber information transmission signal received from a subscriber management server device; and
    a transmission unit configured to transmit a signal including specific information of a determined standby radio access network of the mobile station to a radio access network device of the first radio access network.

* * * * *